(12) United States Patent
Uchida et al.

(10) Patent No.: US 7,964,870 B2
(45) Date of Patent: Jun. 21, 2011

(54) DISPLAY DEVICE

(75) Inventors: Tsuyoshi Uchida, Mobara (JP); Hiroshi Katayanagi, Chiba (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 450 days.

(21) Appl. No.: 12/131,168

(22) Filed: Jun. 2, 2008

(65) Prior Publication Data

US 2008/0296576 A1 Dec. 4, 2008

(30) Foreign Application Priority Data

Jun. 4, 2007 (JP) ................................. 2007-147593

(51) Int. Cl.
*H01L 29/10* (2006.01)
*H01L 31/00* (2006.01)
*G09G 3/36* (2006.01)

(52) U.S. Cl. ............. 257/59; 257/93; 257/265; 257/272; 257/278; 345/204

(58) Field of Classification Search .................. 349/129; 345/204; 257/59
See application file for complete search history.

(56) References Cited

U.S. PATENT DOCUMENTS

| | | | |
|---|---|---|---|
| 6,407,791 B1* | 6/2002 | Suzuki et al. | 349/129 |
| 6,995,394 B2* | 2/2006 | Hong et al. | 257/59 |
| 2005/0007356 A1* | 1/2005 | Eguchi | 345/204 |

FOREIGN PATENT DOCUMENTS

| | | |
|---|---|---|
| JP | 06-051346 | 2/1994 |
| JP | 2005-303119 | 10/2005 |

\* cited by examiner

*Primary Examiner* — Zandra Smith
*Assistant Examiner* — Tsz K Chiu
(74) *Attorney, Agent, or Firm* — Antonelli, Terry, Stout & Kraus, LLP.

(57) ABSTRACT

To provide a display device capable of reliably forming a resistive element formed on a substrate including pixels. A display device including at least a thin-film transistor and a resistive element on a substrate has a gate electrode, an insulating film, a semiconductor layer and a conductive layer which are sequentially stacked on the substrate, in which the resistive element is formed by using the semiconductor layer formed between end portions of wiring made of the conductive layer as a resistive body, and at least one conductive layer apart from the end portions is formed on the semiconductor layer between the end portions of wiring.

6 Claims, 8 Drawing Sheets

DISPLAY DEVICE

The present application claims priority from Japanese application JP 2007-147593 filed on Jun. 4, 2007, the content of which is hereby incorporated by reference into this application.

BACKGROUND OF THE INVENTION

1. Field of the Invention

The invention relates to a display device, and particularly relates to a display device including a resistive element on a substrate including pixels.

2. Background Art

For instance, an active-matrix liquid crystal display device is configured to sequentially select each pixel row in respective pixels formed in a matrix state in a substrate by turning on thin-film transistors formed on respective pixels by a scanning signal to be supplied through a common gate signal line and to supply a video signal to respective pixels of the pixel row at the selected timing through a drain signal line connected in common to pixels corresponding to other pixel rows.

The thin-film transistors of respective pixels have a configuration which is very much liable to receive electrostatic damage, therefore, it is known that an electrostatic protection circuit is formed on the substrate in the vicinity of a liquid crystal display area formed as an aggregate of pixels.

For example, it is known that the electrostatic protection circuit is formed between an output terminal of a drive circuit for driving the respective pixels and a signal line formed in the liquid crystal display area and a large current pulse due to electrostatic discharge generated at the output terminal is reduced by a resistive element in the electrostatic protection circuit (refer to Patent Document 1 below).

The above electrostatic protection circuit is usually formed in parallel with the formation of pixels for reducing manufacturing processes.

Patent Document 1: JP-A-6-51346
Patent Document 2: JP-A-2005-303119

When the display device including the above configuration is manufactured, there is a case that a so-called resist reflow process is applied (refer to the above Patent Document 2).

When a thin-film transistor of each pixel is formed, a photoresist film used as a mask when forming a drain electrode and a source electrode by patterning is allowed to remain as it is, and a semiconductor layer positioned at a layer under the drain electrode and the source electrode is etched by using a deformed photoresist film obtained by allowing the photoresist film to reflow as a mask, which makes an additional mask process when the semiconductor layer is selectively etched unnecessary.

The resist reflow process is applied also when the electrostatic protection circuit is manufactured, and the formation of the resistive element is also performed in parallel with the manufacture of the thin-film transistor.

However, in the case that the resistive element is formed by applying the resist reflow process in which the semiconductor layer is used as a resistive material and the same material as the drain electrode and the source electrode of the thin-film transistor is used for respective terminals, the inconvenience occurs that it is difficult to form the semiconductor layer long enough in the direction the current flows. That is, it is difficult to secure the length of the semiconductor layer for sufficiently forming a desired resistance value.

In the case that the photoresist film used as a mask when forming respective terminals by patterning is allowed to reflow, the deformed photoresist film on one terminal side and the deformed photoresist film on the other terminal side obtained by the reflow are not continuously formed on the semiconductor layer, therefore, there occurs a cut (separated) point in the semiconductor layer between respective terminals when the semiconductor layer is etched by using the deformed photoresist film as a mask in the above state.

SUMMARY OF THE INVENTION

An object of the invention is to provide a display device capable of reliably forming the resistive element formed on the substrate including pixels.

The outline of a typical invention in inventions disclosed in the present application will be briefly explained as follows.

(1) A display device according to the invention is a display device including, for example, at least a thin-film transistor and a resistive element on a substrate, which has a gate electrode, an insulating film, a semiconductor layer and a conductive layer which are sequentially stacked on the substrate, in which the resistive element is formed by using the semiconductor layer formed between end portions of wiring made of the conductive layer as a resistive body, and at least one conductive layer apart from the end portions is formed on the semiconductor layer between the end portions of wiring.

(2) The display device according to the invention has been made, for example, based on the configuration of (1), in which the semiconductor layer is patterned by etching using a deformed photoresist film obtained by allowing a photoresist film on the patterned conductive layer to reflow as a mask.

(3) The display device according to the invention has been made, for example, based on the configuration of (1), in which the conductive layers formed on the semiconductor layer with the gate electrode being positioned therebetween in a region in which the thin-film transistor is formed when seen in plan view are configured as a drain electrode and a source electrode of the thin-film transistor, and the semiconductor layer in the region in which the thin-film transistor is formed is formed at a region corresponding to a channel region between the drain electrode and the source electrode when seen in plan view as well as formed by including a protruding portion at the outside of the drain electrode and the source electrode excluding the channel region side.

(4) The display device according to the invention has been made, for example, based on the configuration of (1), in which the semiconductor layer between the end portions is formed by including a portion protruding from the conductive layer at a portion in which the conductive layer exists in the direction crossing the direction in which current of the resistive element flows when seen in plan view as well as formed by including a width smaller than the width of the portion in which the conductive layer exists in the portion in which the conductive layer does not exist.

(5) The display device according to the invention has been made, for example, based on the configuration of (1), in which the conductive layer between the end portions includes plural conductive layers apart from one another in the direction crossing the direction in which current of the resistive element flows.

(6) The display device according to the invention has been made, for example, based on the configuration of (1), in which the resistive element is formed in an electrostatic protection circuit.

(7) The display device according to the invention has been made, for example, based on the configuration of (1), in which the display device is a liquid crystal display device.

The invention is not limited to the above configuration and various modifications can be performed within the range not departing from the gist of the invention.

The display device configured as the above can reliably form a resistive element formed on a substrate including pixels.

DETAILED DESCRIPTION OF THE PREFERRED EMBODIMENTS

Hereinafter, embodiments of a display device according to the invention will be explained with reference to the drawings.
<Whole Configuration>

Figure 2A:
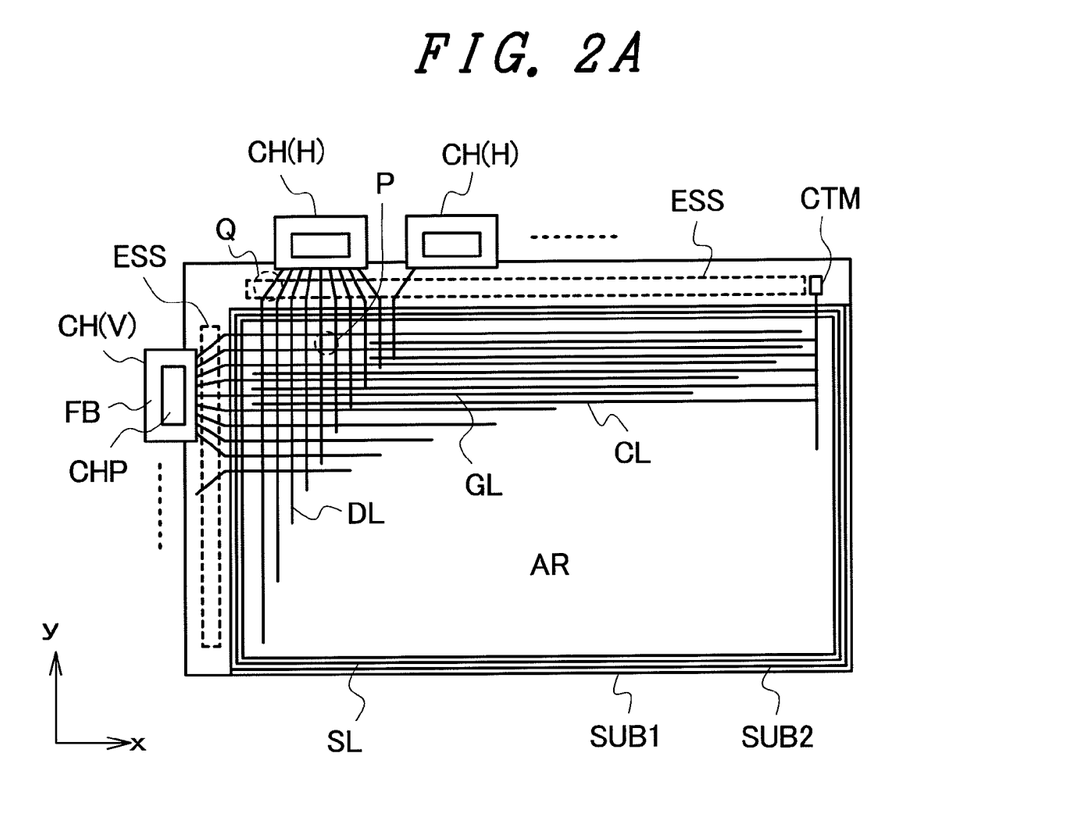
FIG. 2 is the whole configuration showing an embodiment of the display device according to the invention.
Figure 2B:
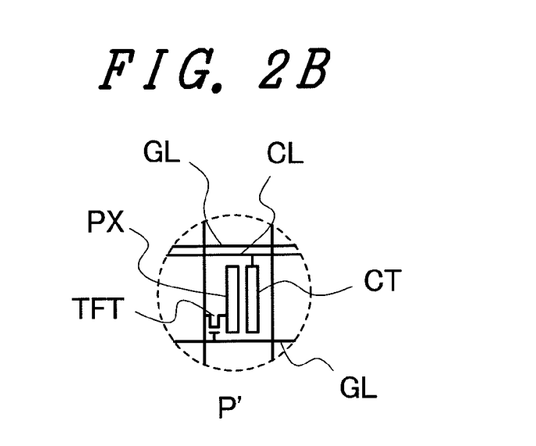

FIG. 2A and 2B show a display device according to the invention by taking a liquid crystal display device as an example, which is a schematic plan view showing an embodiment of the liquid crystal display device.

In FIG. 2A, a liquid crystal display device includes a pair of substrates SUB1, SUB2, for example, made of glass which are arranged in parallel as envelopes, and liquid crystal (not shown) is interposed between the substrates SUB1, SUB2.

The liquid crystal is sealed by a sealant SL also used for fixing the substrate SUB2 to the substrate SUB1, and an area surrounded by the sealant SL forms a liquid crystal display area AR.

For example, the area of the substrate SUB1 is formed to be larger than the area of the substrate SUB2, and the substrate SUB1 has a region exposed from the substrate SUB2 at left-side edge portion and an upper-side edge portion in the drawing.

At the left-side edge portion of the substrate SUB1, a scanning signal drive circuit including plural respective semiconductor devices CH (V) arranged in parallel which were formed by, for example, a tape carrier method is connected as well as an electrostatic protection circuit ESS is formed in the vicinity thereof on the substrate SUB1. At the upper-side edge portion on the substrate SUB1, a video signal drive circuit including plural respective semiconductor devices CH (H) arranged in parallel which were formed by, for example, a tape carrier method is connected as well as an electrostatic protection circuit ESS is formed in the vicinity thereof on the substrate SUB1. The electrostatic protection circuit ESS is configured to avoid electrostatic damage of thin-film transistors TFTs in respective pixels which is described later.

The semiconductor device formed by the tape carrier method is configured by a flexible substrate FB on which a semiconductor chip CHP is mounted. The flexible substrate FB includes a lead leading from an input terminal to an output terminal for supplying signals to the liquid crystal display device through the semiconductor chip CHP, though not shown.

To input terminals of the semiconductor devices CH (V), CH (H), signals are inputted from the side of a not-shown printed substrate.

On the surface of the liquid crystal side of the substrate SUB1 in the liquid crystal display area AR, gate signal lines GL extending in the x direction and arranged in parallel in the y direction in the drawing and drain signal lines DL extending in the y direction and arranged in parallel in the x direction are formed.

The rectangular region surrounded by the gate signal lines GL and the drain signal lines DL forms the region in which each pixel is formed, accordingly, respective pixels are arranged in a matrix state in the liquid crystal display area AR.

The each gate signal line GL is extended over the sealant SL at, for example, a left-side end thereof, connected to the output terminal of the semiconductor device CH (V) included in the scanning signal drive circuit through the electrostatic protection circuit ESS, and a scanning signal (voltage) is supplied by the scanning signal drive circuit. Similarly, the each drain signal line DL is extended over the sealant SL at, for example, an upper-side end thereof, connected to the output terminal of the semiconductor device CH (H) included in the video signal drive circuit through the electrostatic protection circuit ESS, and a video signal (voltage) is supplied by the video signal drive circuit H.

As shown in a dashed-line circular frame P' in FIG. 2B which is an enlarged view of a dashed-line circular frame P in FIG. 2A, each pixel includes a thin-film transistor TFT which is turned on by a scanning signal from the gate signal line GL, a pixel electrode PX to which a video signal from the drain signal line DL is supplied through the thin-film transistor TFT which is in the on-state and a counter electrode CT generating electric field with respect to the pixel electrode PX according to the application of reference voltage. The electric field includes an electric field component which is parallel to the surface of the substrate SUB1, and a system in which liquid crystal molecules are allowed to behave by such electric field is called as, for example, the in-plane switching.

To the counter electrode CT, reference voltage is applied thorough a common signal line CL arranged in parallel with, for example, the gate signal line GL, and the common signal line CL is extended over the sealant SL, connected to a common terminal CTM formed on the surface of the substrate SUB1.

In the liquid crystal display device, a pixel row including respective pixels arranged along the gate signal line GL is selected by a gate signal being supplied to the gate signal line GL, and a video signal is supplied to respective pixels of the pixel row through the corresponding drain signal line DL at the timing of the selection.

The electrostatic protection circuit ESS is formed at the region outside of the sealant SL on the substrate SUB1, however, it is not limited to the configuration and it is also preferable that it is formed at a region inside the sealant SL or formed by being partially superimposed on the sealant SL.

In the above embodiment, the semiconductor device CH (V) included in the scanning signal drive circuit and the semiconductor device CH (H) included in the video signal drive circuit are shown as the ones formed by the tape carrier method, however, they are not limited to this and it is also preferable that the semiconductor chip itself is mounted on the substrate SUB1 as it is.

<Configuration of Pixel>

Figure 3:
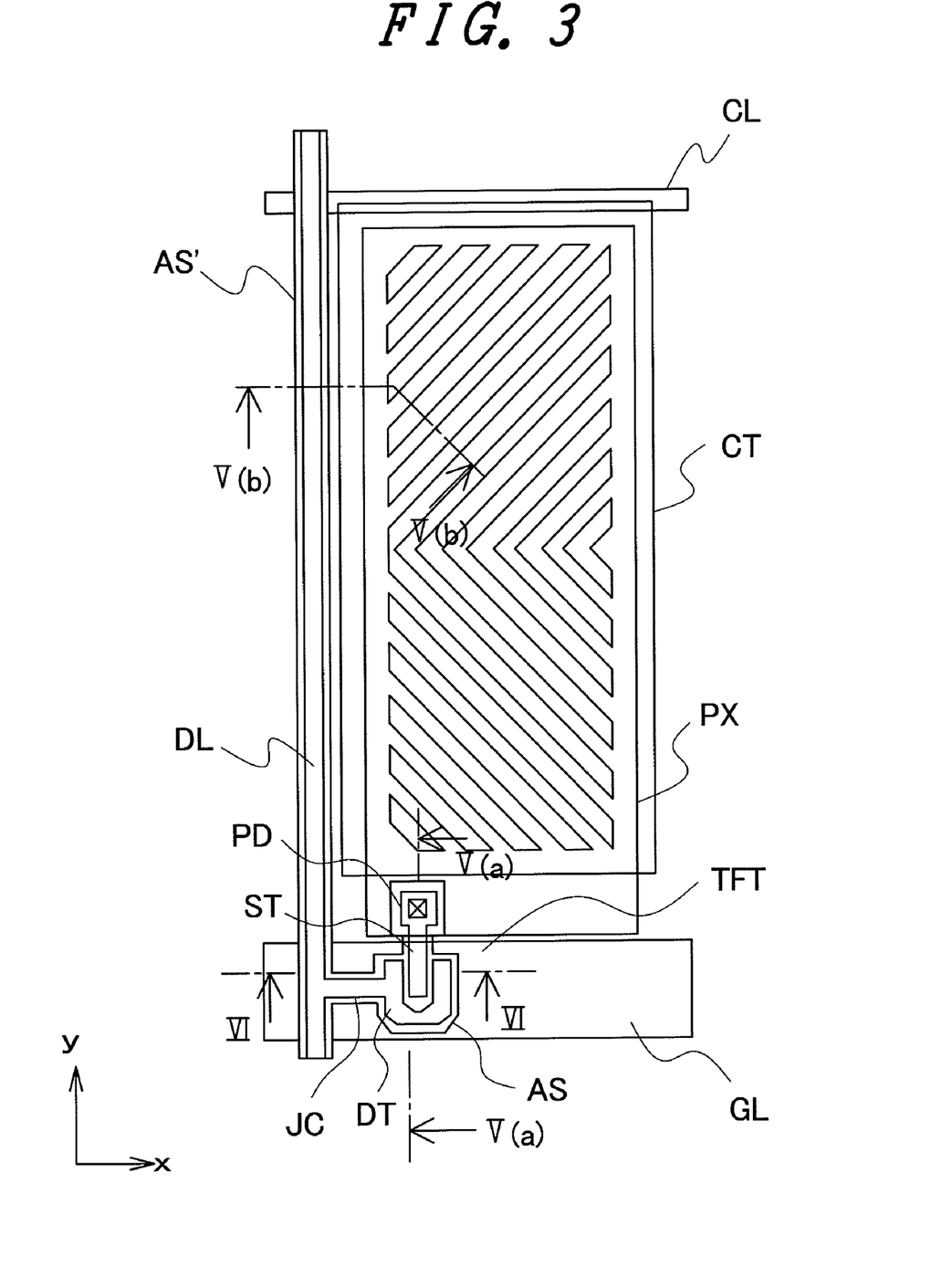
FIG. 3 is a plan view showing an embodiment of a configuration of a pixel of the display device according to the invention.

FIG. 3 is a plan view showing an embodiment of one pixel of respective pixels arranged in a matrix state on the side of the substrate SUB1 on the liquid crystal display panel PNL. Accordingly, respective pixels respectively arranged above and below as well as at left and right with respect to the pixel shown in FIG. 3 have the same configuration as this pixel.

Figure 4A:
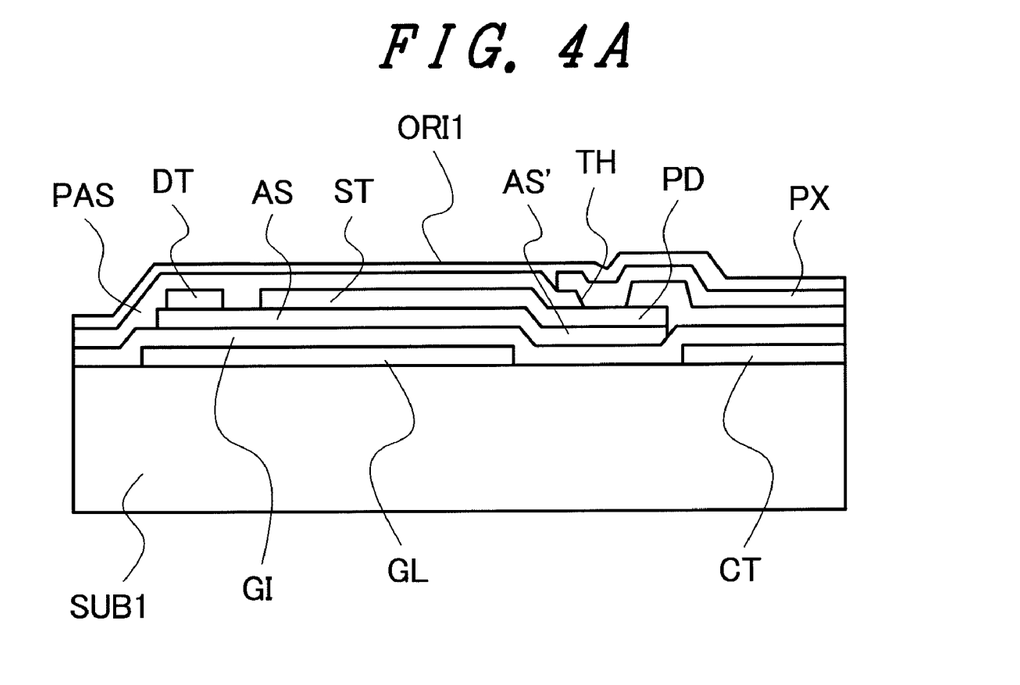
FIG. 4A shows a cross-sectional view taken along the line V(a)-V(a) of FIG. 3.
Figure 4B:
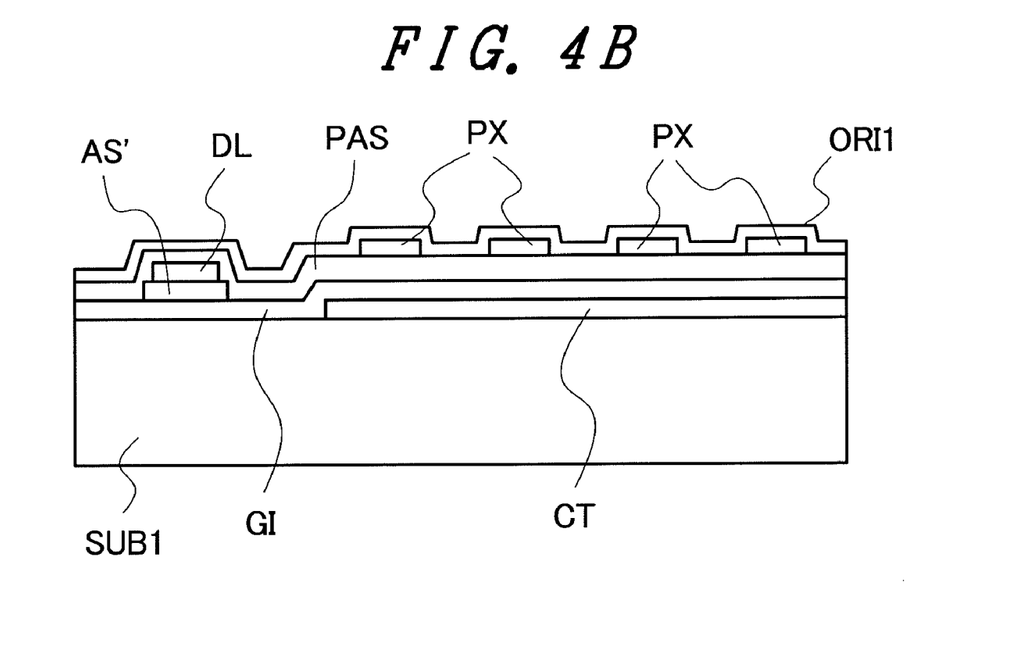
FIG. 4B shows a cross-sectional view taken along the line V(b)-V(b) of FIG. 3, respectively.

FIG. 4A shows a cross-sectional view taken along the line V(a)-V(a) of FIG. 3 and FIG. 4B shows a cross-sectional view taken along the line V(b)-V(b) of FIG. 3, respectively.

First, the gate signal line GL and a common signal line CL are formed in parallel at a relatively large distance on the face (surface) on the liquid crystal side of the substrate SUB1.

At a region between the gate signal line GL and the common signal line CL, a counter electrode CT made of a transparent conductive material such as ITO (Indium-Tin-Oxide) is formed. The counter electrode CT is formed superimposed on the common signal line CL at an edge portion on the side of the common signal line CL, which is electrically connected to the common signal line CL.

Then, an insulating film GI (refer to FIG. 4) is formed on the surface of the substrate SUB1 so as to cover the gate signal line GL, the common signal line CL and also the counter electrode CT. The insulating film GI functions as a gate insulating film of the thin-film transistor TFT in a later-described region in which the thin-film transistor TFT is formed, and the film thickness and the like are set accordingly.

An amorphous semiconductor layer AS made of, for example, amorphous silicon is formed on the upper surface of the insulating film GI at a place where the layer is superimposed over a part of the gate signal line GL. The semiconductor layer AS will be the semiconductor layer of the thin-film transistor TFT.

The semiconductor layer AS is formed not only at the region in which the thin-film transistor TFT is formed but also below the drain signal line DL, below a junction JC which connects the drain signal line DL and a drain electrode DT of the thin-film transistor TFT electrically and below a portion of a source electrode of the thin-film transistor TFT extending over the region where the thin-film transistor TFT is formed (including a pad portion PD), respectively. The semiconductor layer AS is formed in the above pattern by forming the thin-film transistor TFT using a later-described resist reflow process, which allows the drain signal line DL to be formed flatly, as a result, the inconvenience of disconnection due to step differences can be avoided. In the following description, the semiconductor layer formed at a region other than the region in which the thin-film transistor TFT is formed in the semiconductor layer AS is sometimes shown by a code AS'.

Then, the drain signal line DL is formed extending in the y direction in the drawing. The drain signal line DL has an extending portion which extends to the thin-film transistor TFT side at a part thereof, and the extending portion (junction JC) is connected to the drain electrode DT of the thin-film transistor TFT formed on the semiconductor layer AS.

In addition, the drain signal line DL and the source electrode ST formed at the same time with the formation of the drain electrode DT face the drain electrode DT on the semiconductor layer AS, and the source electrode ST is formed with an extending portion slightly extending from the semiconductor layer AS to the pixel region side. The extending portion is configured to reach the pad portion PD connected to the pixel electrode PX which is explained layer.

The drain electrode DT is formed, for example, in a U-shape pattern so as to surround a tip portion of the source electrode ST. Accordingly, the thin-film transistor TFT can be configured to have large channel width.

The semiconductor layer AS is formed by, for example, high concentration impurity being doped on the surface thereof when it is formed on the insulating film GI, and a high-concentration impurity layer formed at regions other than the region in which the drain electrode DT and the source electrode ST are formed is etched by using a photoresist film on the drain electrode DT and the source electrode ST as a mask after the drain electrode DT and the source electrode ST are formed by patterning. This is for allowing the high-concentration impurity layer (shown as a high-concentration impurity layer CNL layer in FIG. 6 and FIG. 7) to remain between the semiconductor layer AS and the drain electrode DT and the source electrode ST respectively to form the impurity layer as an ohmic contact layer.

According to the above, the thin-film transistor TFT is configured to be a MIS (Metal Insulator Semiconductor) transistor having a so-called inversely staggered structure, using the gate signal line GL as a gate electrode.

The MIS transistor is driven by application of bias so that the drain electrode DT is switched to the source electrode ST, however, in the explanation of the specification, the side connected to the drain signal line DL is called as the drain electrode DT and the side connected to the pixel electrode PX is called as the source electrode ST for convenience.

On the surface of the substrate SUB1, a protection film PAS (refer to FIG. 4) made of an insulating film is formed, covering over the thin-film transistor TFT. The protection film PAS is provided for avoiding the direct contact between the thin-film transistor TFT and the liquid crystal. In addition, the protection film PAS is provided being interposed between the counter electrode CT and the later-described pixel electrode PX, also functioning as a dielectric film of a capacitor element provided between the counter electrode CT and the pixel electrode PX together with the insulating film GI.

On the upper surface of the protection film PAS, the pixel electrode PX is formed. The pixel electrode PX is made of a transparent conductive film such as ITO (Indium-Tin-Oxide), which is formed being superimposed on the counter electrode CT over the large area.

In the pixel electrode PX, many slits are formed in parallel in the direction crossing the longitudinal direction thereof, thereby having an electrode group including many band-shaped electrodes whose both ends are connected to each other.

The respective electrodes of the pixel electrode PX are formed so that the pixel region is divided into two, for example, above and below in the drawing, and respective electrodes extend in the +45 degrees direction with respect to the running direction of the gate signal line GL in one region, and extend in the −45 degrees direction in the other region. It applies a so-called multi-domain system, having a configuration in which the inconvenience of generating coloring according to the viewing direction is solved when the direction of slits provided in the pixel electrode PX in one pixel (direction of the electrode group of the pixel electrode PX) is a single direction.

The pixel electrode PX formed as described above is electrically connected to the pad portion PD of the source electrode ST of the thin-film transistor TFT through a through hole TH formed in the protection film PAS at the edge portion on the side of the thin-film transistor TFT.

On the surface of the substrate SUB1, an alignment layer ORI 1 (refer to FIG. 4) is formed covering over the pixel electrode PX, setting the initial alignment direction of liquid crystal molecules which directly touch the alignment layer ORI 1 by the alignment layer ORI 1.

In the above embodiment, amorphous silicon is used as the semiconductor layers AS, AS', however, it is not limited to this and it is also preferable to use polysilicon and the like.

<Electrostatic Protection Circuit>

Figure 5:
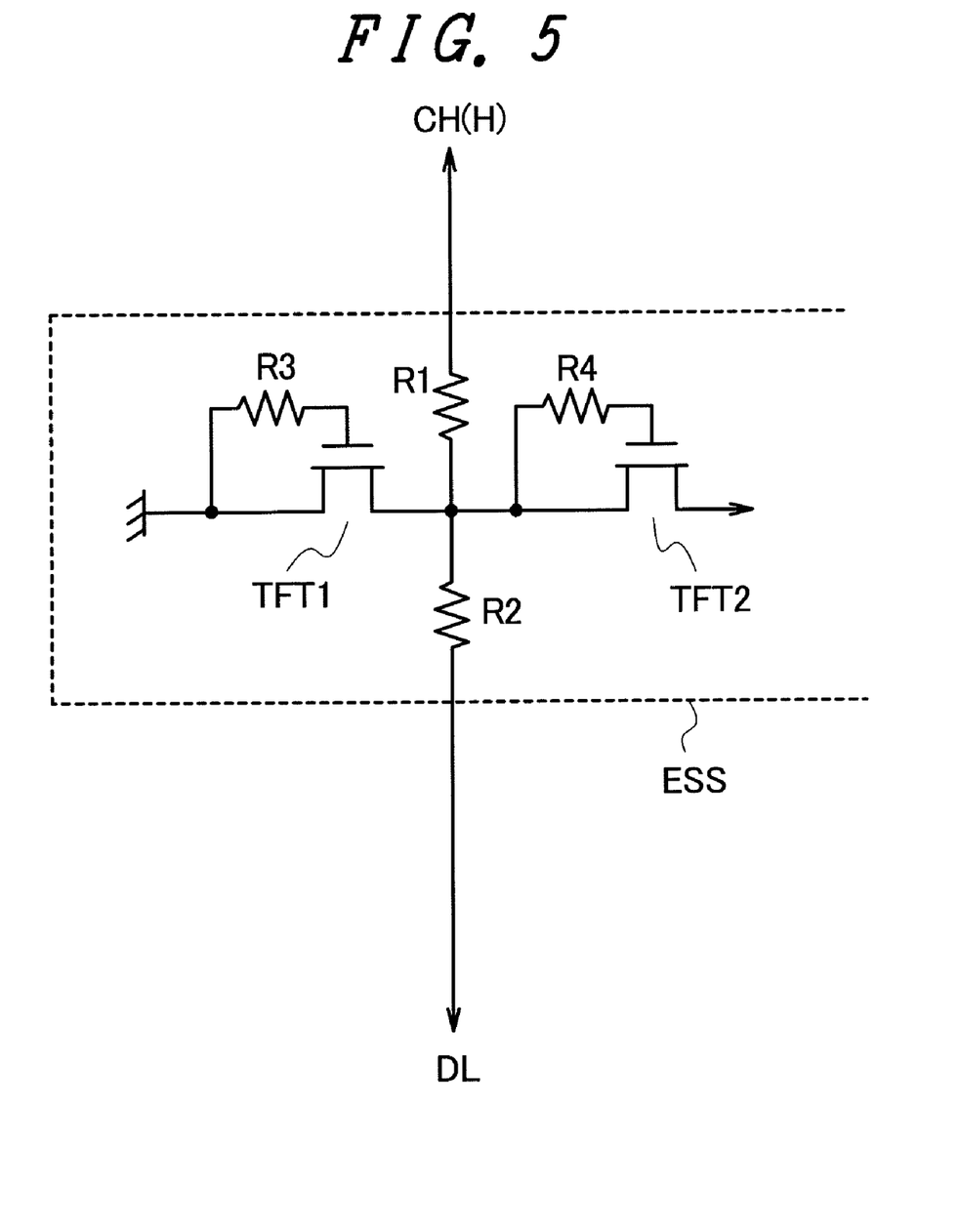
FIG. 5 is a circuit diagram showing an embodiment of an electrostatic protection circuit formed in the display device according to the invention.

FIG. 5 is a view shown by enlarging a part in the dashed line circle Q of FIG. 2, which is a circuit diagram showing a part of the electrostatic protection circuit ESS formed on the substrate SUB1.

The electrostatic protection circuit ESS is formed in parallel with the formation of respective pixels in the liquid crystal display area AR.

In FIG. 5, a serial connection body of resistive elements R1, R2 is connected between one output terminal of the semiconductor device CH (H) and the drain signal line DL. When an electrostatic pulse is applied to the output terminal by some cause, the large current is reduced by the resistive elements R1, R2.

A diode-connected thin-film transistor TFT 1 is connected between a ground line and an intermediate junction of the resistive elements R1, R2, and a diode-connected thin-film transistor TFT 2 is connected between a power supply line and an intermediate junction of the resistive elements R1, R2.

When positive voltage is applied to the output terminal, charges are bypassed through the thin-film transistor TFT 1 connected to the side of the ground line and when negative voltage is applied to the output terminal, punch-through current or breakdown current flows through the thin-film transistor TFT 2 connected to the side of the power supply line, which prevents direct application of extraordinarily high voltage to the drain signal line DL.

When the gate voltage increases in the positive direction in the thin-film transistors TFT 1, TFT 2 through resistive elements R3, R4, drain current in the forward direction flows, and when the voltage varies in the negative direction, drain current in the reverse direction flows drastically due to the punch-through or the breakdown.

The resistive elements R3, R4 respectively function so as to alleviate the time slant of voltage variation, allowing the respective thin-film transistors TFT 1, TFT 2 to operate stably.

The electrostatic protection circuit ESS formed in the vicinity of the semiconductor device CH (H) included in the video signal drive circuit is shown in FIG. 5, and the electrostatic protection circuit ESS formed in the vicinity of the semiconductor device CH (V) included in the scanning signal drive circuit has the same configuration.

The electrostatic protection circuit ESS is not limited to the above configuration and the invention can be applied to electrostatic protection circuits having other configurations if the resistive element is included therein.

<Resistive Element>

FIG. 1A to FIG. 1D are configuration views showing one embodiment of a resistive element RS in the resistive elements R1 to R4.

Figure 1A:
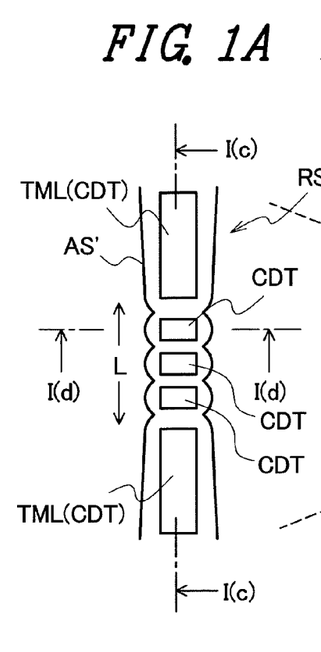
FIG. 1A to FIG. 1D are configuration views showing an embodiment of a resistive element formed on a display device according to the invention.
Figure 1B:
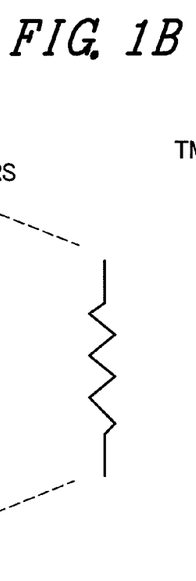
Figure 1C:
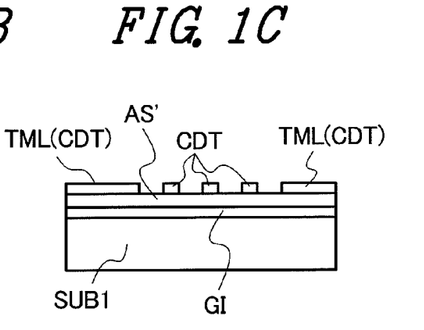
Figure 1D:
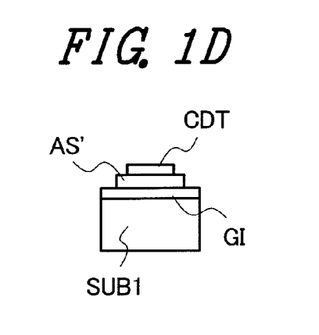

FIG. 1A shows a plan view, FIG. 1B is an equivalent circuit, FIG. 1C is a cross-sectional view taken along the line I(c)-I(c) of FIG. 1A, and FIG. 1D shows a cross-sectional view taken along the line I(d)-I(d) of FIG. 1A.

The resistive element RS is formed by the later-described resist reflow process on the substrate SUB1 as well as, for example, on the surface of the insulating film GI.

First, as shown in FIG. 1A, the semiconductor layer AS' extending in one direction (vertical direction in the drawing) is formed on the insulating film Gi.

On the surface of the semiconductor layer AS', a conductive layer CDL having relatively long length, three conductive layers CDLs having relatively short length and a conductive layer CDL having relatively long length are arranged at certain intervals along the extending direction thereof.

The conductive layers CDLs having relatively long length positioned at both sides in the respective conductive layers CDLs form terminals TMLs of the resistive element RS.

According to this, the semiconductor layer AS' in the range of the length "L" arranged between edges of respective terminal TMLs opposed each other functions as resistive material of the resistive element RS.

The respective three conductive layers CDLs having relatively short length are formed so as to sufficiently secure the length "L" without being cut (separated) in the middle on the semiconductor layer AS' functioning as the resistive material of the resistive element RS when the resistive element RS is formed by the resist reflow process. This will be described later again.

As the resistive element RS is formed by the resist reflow process, the semiconductor layer AS' will have the characteristic configuration that it is formed in the width including a protruding portion in the direction crossing the direction of arranging the respective conductive layers CDLs as well as formed in the width smaller than the above width at points where respective conductive films CDLs are separated, which is a pattern in which the width varies smoothly as shown in FIG. 1A.

The number or the interval distance of other conductive layer CDLs other than respective terminals TMLs in the respective conductive layers CDLs are set according to a resistance value to be obtained by the resistive element RS, therefore, it is not limited to the configuration shown in FIG. 1A to FIG. 1D. However, it is necessary that the semiconductor layer AS' arranged between the conductive layers CDLs to be respective terminals TMLs are not cut (separated) even the width thereof is formed to be narrow. That is because the semiconductor layer AS' functions as the resistive element RS.

<Manufacturing Method>

FIG. 6A to FIG. 6C, FIG. 7A to FIG. 7C are process drawings showing an embodiment of a manufacturing method of the above display device.

In respective drawings, process drawings shown on the left side in the drawings are cross-sectional views taken along the line VI-VI of FIG. 3, process drawings shown at the center of the drawings are cross-sectional views taken along I(c)-I(c) line of FIG. 1A, and process drawings shown on the right side of the drawings are cross-sectional views taken along the line I(d)-I(d) of FIG. 1A. Hereinafter, explanation will be made in the order of process.

Figure 6A:
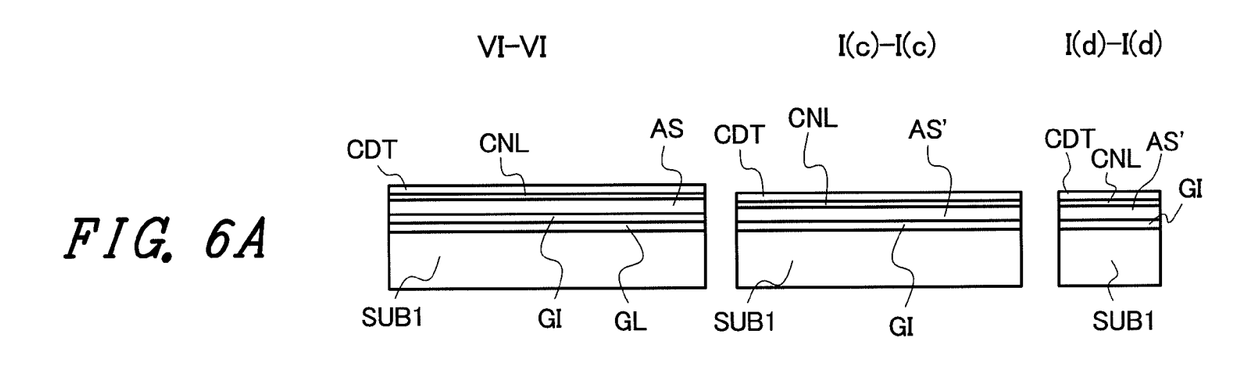
FIG. 6A to FIG. 6C are views showing processes of an embodiment of a manufacturing method of the display device according to the invention, which is shown continuously to FIG. 7.

First, as shown in FIG. 6A, the substrate SUB1 is prepared, in which the gate signal line GL, the common signal line CL, the counter electrode CT and the insulating film GI covering over the gate signal line GL, the common signal line CL, and the counter electrode CT are formed on a main surface (surface of the side of liquid crystal).

Then, the semiconductor layer AS and the conductive layer CDT are sequentially stacked on the whole upper surface of the insulating film GI of the substrate GI by using, for example, a CVD process.

The semiconductor layers AS, AS' are made of, for example, amorphous Si, including the high concentration impurity layer CNL to which a high concentration n-type impurity is doped on the surface thereof. The high concentration impurity layer CNL is allowed to function as an ohmic contact layer in the region in which the thin-film transistor is formed.

Figure 6B:
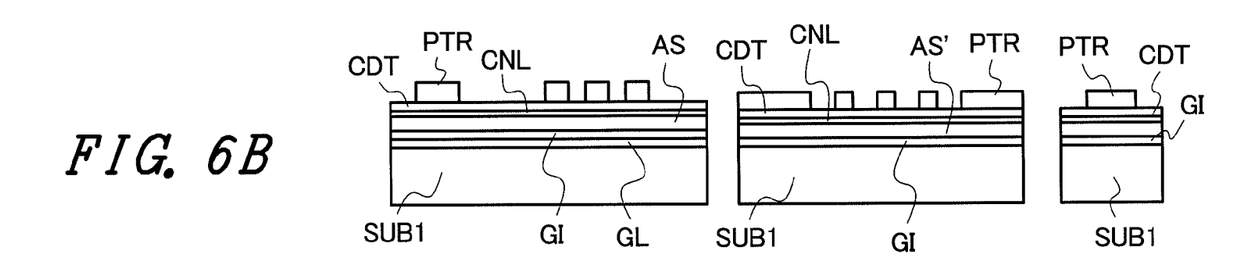

Next, as shown in FIG. 6B, a photoresist film PTR is coated on the whole surface of the conductive layer CDT, and the photoresist film PTR is selectively removed by a well-known photolithography technique to be patterned. In this case, the pattern of the remained photoresist film PTR is the same as the pattern of the conductive layer CDT which will remain by the selective etching.

Figure 6C:
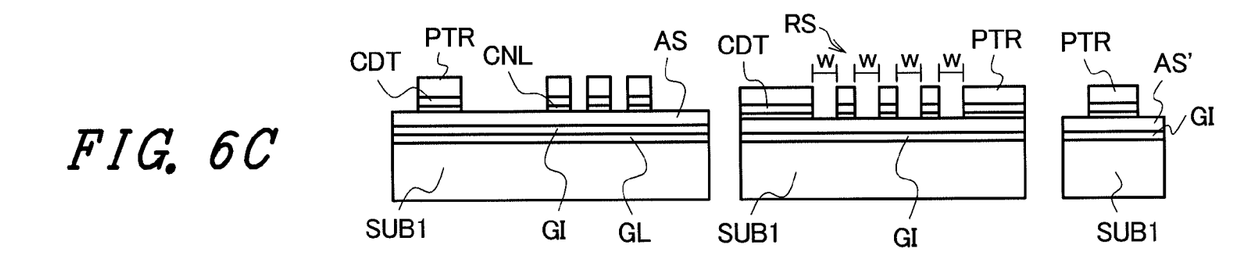

Next, as shown in FIG. 6C, the conductive layer CDT and the high concentration impurity layer CNL are sequentially etched using the remained photoresist film PTR as a mask. Here, for example, wet etching is used in the conductive layer CDT, and dry etching is used in the high concentration impurity layer CNL.

In this case, in a region in which the resistive RS is formed, plural conductive layers CDL (including terminals TMLs) are arranged in parallel along the direction in which current flows as shown in FIG. 1A, it is important to set the interval distance therebetween to be relatively narrow. In this case, the interval distance is, for example, "w". The reason of setting the value to "w" will be explained after the explanation of a process shown by FIG. 7B.

Figures 7A, 7B:
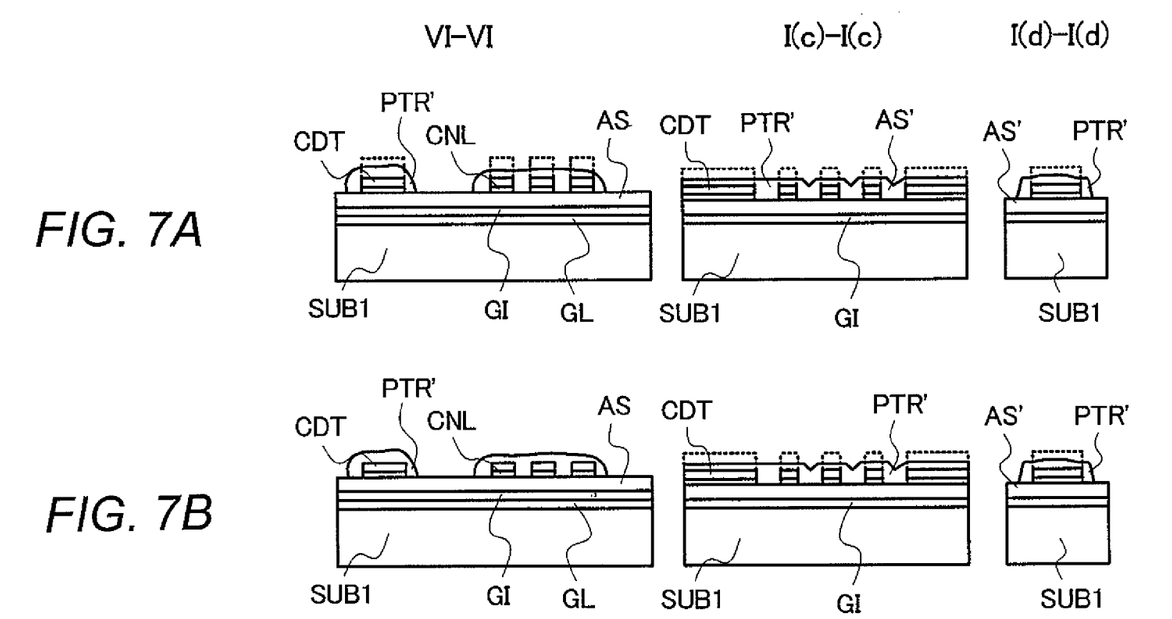
FIG. 7A to FIG. 7C are views showing processes of an embodiment of the manufacturing method of the display device according to the invention, which is shown continuously from FIG. 6.

Next, as shown in FIG. 7A, a deformed photoresist film PTR' is formed by allowing the photoresist film PTR to reflow. The deformed photoresist film PTR' by the reflow is formed in a manner in which, for example, the photoresist film PTR is exposed in vapor of organic solution for one to three minutes, thereby allowing the organic solution to gradually infiltrate into the photoresist film PRT to make dissolution on the photoresist film PTR.

According to the reflow, the photoresist film PRT formed above the patterned conductive layer CDT protrudes and flows outward from the outline of the conductive layer CDT. Accordingly, the photoresist film PTR flows over the semiconductor layer AS corresponding to a channel region between the drain electrode DT and the source electrode ST to cover the portion.

Next, as shown in FIG. 7B, the photoresist film PTR' which had the reflow is used as a mask, and the semiconductor layer AS exposed from the mask is etched by using dry etching such as ashing.

Here, the reason of setting the interval distance between plural conductive layers CDLs (including the terminals TMLs) to "w" in the region in which the resistive element RS is formed in the process shown in FIG. 6C will be explained.

Figure 8A:
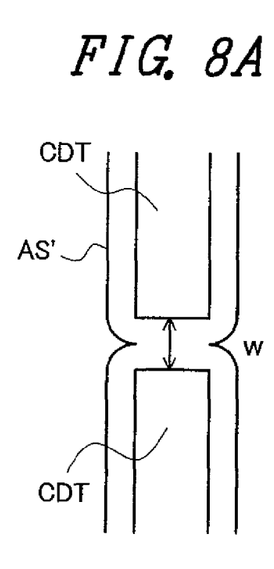
FIG. 8A to FIG. 8C are explanation views concerning setting of values of the interval distance of conductive layers formed side by side in the formation of a resistive element.
Figure 8B:
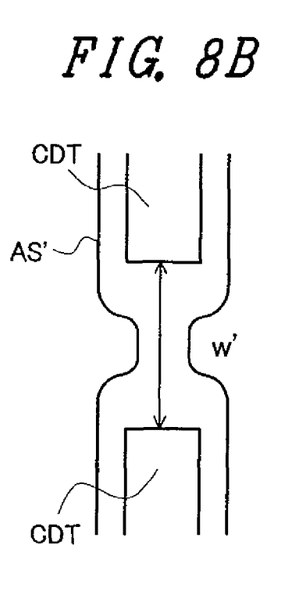
Figure 8C:
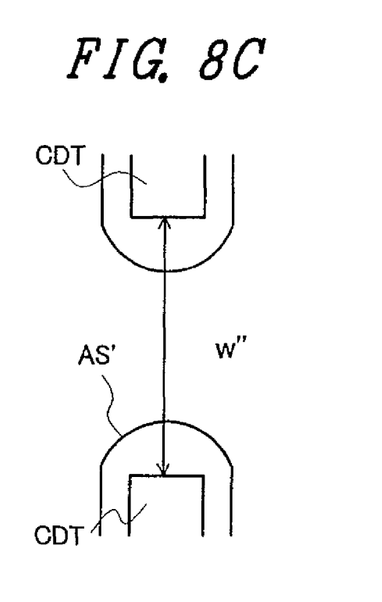

FIG. 8A to FIG. 8C show cases in which the interval distance between adjacent respective conductive layers CDLs is w in FIG. 8A, w' in FIG. 8B and w" in FIG. 8C. The respective w, w' and w" have the relation of w<w'<w".

In the above cases, when the semiconductor layer AS' under the conductive layer CDL is selectively etched using the deformed resist film by the resist reflow process, the semiconductor layer AS' is formed to have sufficient width between respective conductive layers CDLs in FIG. 8A, the semiconductor layer AS' is formed to have a portion having extremely narrow width in FIG. 8B and the semiconductor layer AS' is cut (separated) in FIG. 8C.

The deformed resist film is formed by allowing the photoresist remaining on the surface of the patterned conductive layer CDL to reflow, the each other's connecting relation of photoresist which had the reflow gradually becomes poor in the cases of FIG. 8A, FIG. 8B and FIG. 8C. The pattern of the deformed resist film after the reflow corresponds to the one replaced with the pattern of the semiconductor layer AS' shown in the drawing.

It is necessary to form the semiconductor layer AS' existing between respective terminals TMLs of the resistive element RS without being cut (separated), it is preferable that the interval distance of respective conductive layers CDLs formed on the upper surface of the semiconductor layer AS' are the above-described value w or w' when showing by the examples in FIG. 8A to FIG. 8C.

Figure 7C:
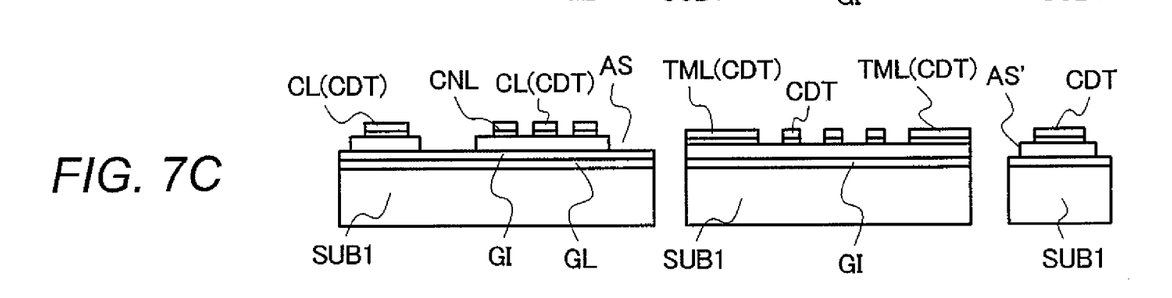

As shown in FIG. 7C, the photoresist film PTR' is removed to complete the formation of the thin-film transistor TFT and the resistive element RS.

After that, the protection film PAS is formed so as to cover the thin-film transistor TFT and the resistive element RS though not known, and the pixel electrode PX is formed on the upper surface thereof. The pixel electrode PX is electrically connected to the pad portion PD formed as an extended portion of the source electrode ST of the thin-film transistor TFT through the through hole TH formed in the protection film PAS.

Then, the alignment layer ORI 1 covering the pixel electrode PX is formed at least in the liquid crystal area AR.

<Other Embodiments>

In the above embodiment, in the region in which the resistive element RS is formed when seen in plan view, for example, five conductive layers CDTs are formed at intervals therebetween on the semiconductor layer AS' along the current direction of the resistive element RS, and respective conductive layers CDTs at both sides are formed as the terminals TMLs of the resistive element RS. Accordingly, the number of the conductive layers CDTs other than the terminals TMLs for forming the semiconductor layer AS' in a connected state is set to three.

However, the number of the conductive layers CDTs is not limited to three but can be optionally selected according to the value to be the resistance value which is in proportion to the length of the semiconductor layer AS' functioning as resistive material.

The other conductive layers CDTs other than the conductive layers CDTs formed as the terminals TMLs of the resistive element RS can be configured by plural conductive layers CDTs provided at intervals therebetween in the direction crossing the current direction of the resistive element RS. Also according to this manner, the semiconductor layer AS' between the respective terminals TMLs can be formed without being cut (separated).

Figure 9A:
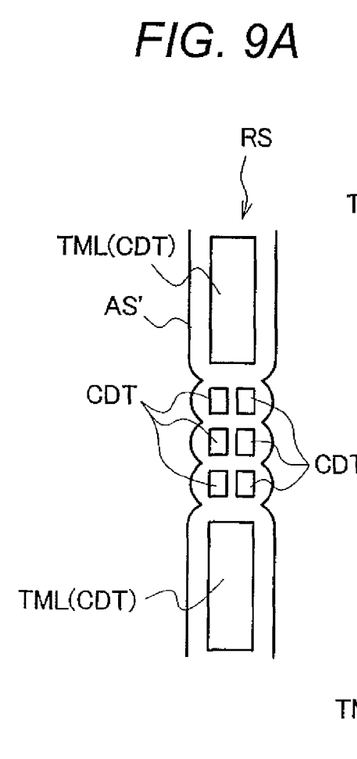
FIG. 9A to FIG. 9C are configuration views showing other embodiments of the resistive element formed for the display device according to the invention.
Figures 9B, 9C:
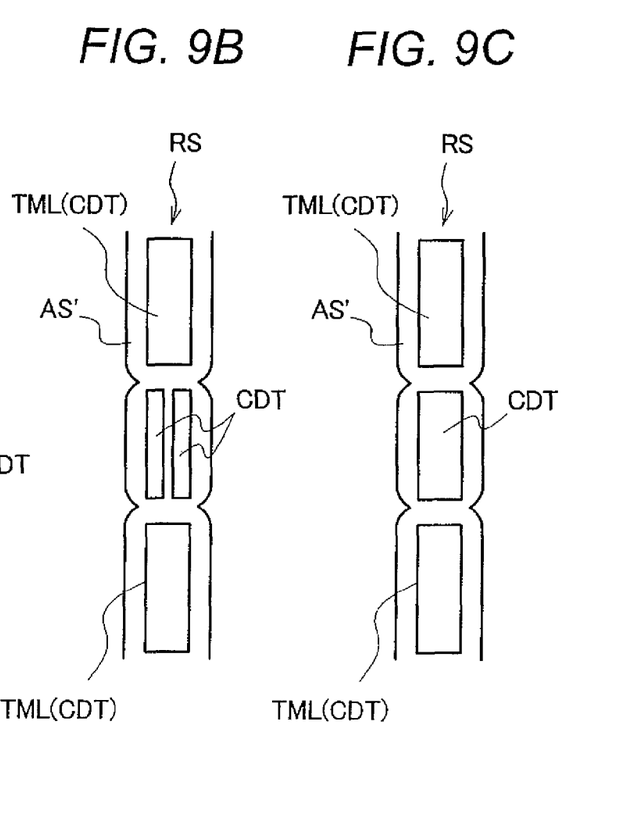

FIG. 9A or FIG. 9C are views showing other embodiments showing variant patterns of the conductive layers CDTs in the resistive element RS based on the above reason. In FIG. 9A, other conductive layers CDTs other than the conductive layers CDTs formed as the terminals TMLs are configured by arranging three pieces in parallel in the current direction of the resistive element RS and two pieces in parallel in the direction crossing the current direction. In FIG. 9B, other conductive layers CDTs other than the conductive layers CDTs formed as the terminals TMLs are configured by arranging one piece in the current direction of the resistive element RS and two pieces in parallel in the direction crossing the current direction. In FIG. 9C, other conductive layers CDTs other than the conductive layers CDTs formed as the terminals TMLs are configured by arranging only one piece in both the current direction of the respective element RS and the direction crossing the current direction.

In this case, as seen in all of FIG. 9A to FIG. 9C, the semiconductor layer AS' in the region in which the resistive element RS is formed is formed by including a portion protruding from the conductive layer CDT in the portion where the conductive layer CDT exists in the direction crossing the current direction of the resistive element RS when seen in plan view, and formed by including the width smaller than the width of the portion where the conductive layer CDT exists in the portion where the conductive layer CDT does not exist.

In the embodiment, the configuration of the resistive element of the electrostatic protection circuit ESS formed on the substrate has been shown. However, the invention is not limited to the resistive element in the electrostatic protection circuit ESS, but can be applied to a resistive element in other circuits. In short, the invention can be applied to a liquid crystal device including a resistive element formed in parallel with the manufacture of pixels including thin-film transistors on the substrate.

In addition, the invention is explained by taking the liquid crystal device as an example. However, the invention can be also applied to other display devices such as an organic EL display device if it includes a resistive element formed in parallel with the manufacture of pixels including thin-film transistors.

The above-described embodiments can be used separately or used by combining them respectively. That is because respective embodiments are effective separately or synergistically.

What is claimed is:

1. A display device including a pair of substrates, wherein, on one of the substrates, a plurality of gate signal lines, a plurality of drain signal lines, a plurality of thin-film transistor and a plurality of pixel electrodes are formed comprising:
   one of the gate signal lines, an insulating film, a semiconductor layer and a conductive layer which are sequentially stacked on the one substrate;
   a video signal drive circuit connected to one of the drain signal lines,
   a scanning signal drive circuit connected to one of the gate signal lines, and
   an electrostatic protection circuit formed between the video signal drive circuit and the drain signal line or between the scanning signal drive circuit and the gate signal line,
   wherein the electrostatic protection circuit includes a resistive element formed by a wiring comprised of the conductive layer, said resistive element including an intermittent portion and the semiconductor layer, which formed on the intermittent portion, and
   wherein at least one island shaped conductive layer is formed in the intermittent portion, and wherein the semiconductor layer is connected to the wiring and island shaped conductive layer.

2. The display device according to claim 1, wherein the semiconductor layer is patterned by etching using a deformed photoresist film obtained by allowing a photoresist film on the patterned conductive layer to reflow as a mask.

3. The display device according to claim 1, wherein the conductive layers formed on the semiconductor layer with the gate signal line being positioned therebetween in a region in which the thin-film transistor is formed when seen in plan view are configured as a drain electrode and a source electrode of the thin-film transistor, and
   wherein the semiconductor layer in the region in which the thin-film transistor is formed is formed at a region corresponding to a channel region between the drain electrode and the source electrode when seen in plan view as well as formed by including a protruding portion at the outside of the drain electrode and the source electrode excluding the channel region side.

4. The display device according to claim 1, wherein the semiconductor layer on the intermittent portion is formed by including a portion protruding from the conductive layer at a portion in which the conductive layer exists in the direction crossing the direction in which current of the resistive element flows when seen in plan view as well as formed by including a width smaller than the width of the portion in which the conductive layer exists in the portion in which the conductive layer does not exist.

5. The display device according to claim 1, wherein the conductive layer on the intermittent portion includes plural conductive layers apart from one another in the direction crossing the direction in which current of the resistive element flows.

6. The display device according to claim 1, wherein the display device is a liquid crystal display device.

* * * * *